(12) United States Patent
Ichikawa

(10) Patent No.: US 10,211,379 B2
(45) Date of Patent: Feb. 19, 2019

(54) SEMICONDUCTOR LIGHT EMITTING DEVICE AND METHOD FOR MANUFACTURING THE SAME

(71) Applicant: Nichia Corporation, Anan-shi (JP)

(72) Inventor: Masatsugu Ichikawa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 333 days.

(21) Appl. No.: 14/542,271

(22) Filed: Nov. 14, 2014

(65) Prior Publication Data
US 2015/0137164 A1 May 21, 2015

(30) Foreign Application Priority Data
Nov. 15, 2013 (JP) .................. 2013-236935

(51) Int. Cl.
| | | |
|---|---|---|
| *H01L 33/58* | (2010.01) | |
| *H01L 33/60* | (2010.01) | |
| *H01L 33/46* | (2010.01) | |
| *H01L 33/00* | (2010.01) | |
| *H01L 33/10* | (2010.01) | |
| *H01L 33/50* | (2010.01) | |

(52) U.S. Cl.
CPC ............ *H01L 33/58* (2013.01); *H01L 33/005* (2013.01); *H01L 33/10* (2013.01); *H01L 33/46* (2013.01); *H01L 33/60* (2013.01); *H01L 33/507* (2013.01); *H01L 2933/0025* (2013.01); *H01L 2933/0058* (2013.01)

(58) Field of Classification Search
CPC ..................................................... H01L 33/58
See application file for complete search history.

(56) References Cited

U.S. PATENT DOCUMENTS

| | | | | |
|---|---|---|---|---|
| 5,434,426 A | * | 7/1995 | Furuyama | ............... G02B 6/43 250/214 LS |
| 7,652,301 B2 | | 1/2010 | Bierhuizen et al. | |
| 8,669,575 B2 | | 3/2014 | Daicho et al. | |
| 2007/0267646 A1 | * | 11/2007 | Wierer, Jr. | ............ B82Y 20/00 257/98 |

(Continued)

FOREIGN PATENT DOCUMENTS

| | | |
|---|---|---|
| CN | 101878540 | 11/2010 |
| CN | 201754416 U | 3/2011 |

(Continued)

OTHER PUBLICATIONS

Extended European Search Reported dated Apr. 21, 2015 issued in Application No. 14193319.2.

*Primary Examiner* — Fernando L Toledo
*Assistant Examiner* — Lawrence-Linh T Nguyen
(74) *Attorney, Agent, or Firm* — Foley & Lardner LLP

(57) ABSTRACT

Provided is a semiconductor light emitting device 1 includes a semiconductor stacked layer 2 having a light extraction surface 3*a* perpendicular to a stacked surface of the semiconductor stacked layer 2, a light transmissive light guide member 3 disposed on the semiconductor stacked Layer 2, a light reflective member 4 disposed on the light guide member 3, and a light reflective package 5 which has an open portion corresponding to the light extraction surface 3*a* and surrounds peripheral surfaces of the semiconductor stacked layer 2.

4 Claims, 5 Drawing Sheets

(56) References Cited

U.S. PATENT DOCUMENTS

| | | | | |
|---|---|---|---|---|
| 2010/0117111 A1* | 5/2010 | Illek | ............... | H01L 33/382 257/98 |
| 2010/0320479 A1* | 12/2010 | Minato | ............ | H01L 33/505 257/88 |
| 2011/0025190 A1 | 2/2011 | Jagt | | |
| 2011/0069256 A1* | 3/2011 | Ohkubo | ............. | H01L 33/46 349/67 |
| 2011/0248304 A1* | 10/2011 | Ichikawa | ............ | H01L 24/32 257/98 |
| 2014/0225139 A1* | 8/2014 | Park | ............. | H01L 33/58 257/98 |

FOREIGN PATENT DOCUMENTS

| | | |
|---|---|---|
| DE | 1020070 19 776 A1 | 10/2008 |
| EP | 2 854 186 A1 | 4/2015 |
| JP | 2009-295611 A | 12/2009 |
| JP | 2010-087324 A | 4/2010 |
| JP | 2010-537400 A | 12/2010 |
| JP | 2011-515846 A | 5/2011 |
| WO | WO-2010/044240 A1 | 4/2010 |
| WO | WO-2014/180772 A1 | 11/2014 |
| WO | WO-2015/011590 A1 | 1/2015 |

* cited by examiner

SEMICONDUCTOR LIGHT EMITTING DEVICE AND METHOD FOR MANUFACTURING THE SAME

CROSS-REFERENCE TO RELATED APPLICATIONS

This application claims priority under 35 USC 119 from Japanese patent Application No. 2013-236935, filed on Nov. 15, 2013, the disclosures of which are incorporated by reference herein.

BACKGROUND OF THE INVENTION

Field of the Invention

The present disclosure relates to a semiconductor light emitting device and a method for manufacturing the semiconductor light emitting device.

Description of the Related Art

A light emitting diode (hereinbelow, referred to as "LED") is employed as a light source in a lighting device arid various application products such as an optical communication device and a portable electronic device because of its high luminous efficiency, low power consumption, and long life. In a present mainstream white LED, white light formed only by a single LED element (single chip) is achieved on the basis of a combination of a blue LED having a wavelength peak of around 450 nm and a yellow phosphor which converts the wavelength of blue light into a wavelength of around 550 nm.

In recent years, remarkable progress has been made in downsizing and improvement in performance, for example, in a portable electronic device. Accordingly, a semiconductor light emitting device having a smaller size and higher luminance that can be mounted on such a device is required. A downsized semiconductor light emitting device is widely used as a so-called chip size package (CSP). For example, WO 2010/044240 discloses a light emitting module that is provided with a light emitting element, a light wavelength conversion member which converts the wavelength of light emitted from the light emitting element, and a light guide member which narrows down the exit area of light that has passed through the light wavelength conversion member so as to be smaller than the light emission area of the light emitting element. The light emitting module is capable of increasing the luminance by reducing the, exit area of light.

SUMMARY

A semiconductor light emitting device includes a semiconductor stacked layer having a light extraction surface perpendicular to a stacked surface of the semiconductor stacked layer; a light transmissive light guide member disposed on the semiconductor stacked layer; a light reflective member disposed on the light guide member; and a light reflective package that has an open portion corresponding to the light extraction surface and surrounds peripheral surfaces of the semiconductor stacked layer.

The semiconductor light emitting device can achieve downsizing and high luminance by employing a structure capable of increasing the light emission intensity without increasing the area of a light extraction surface.

BRIEF DESCRIPTION TH DRAWINGS

DETAILED DESCRIPTION OF EMBODIMENTS

Figure 1:
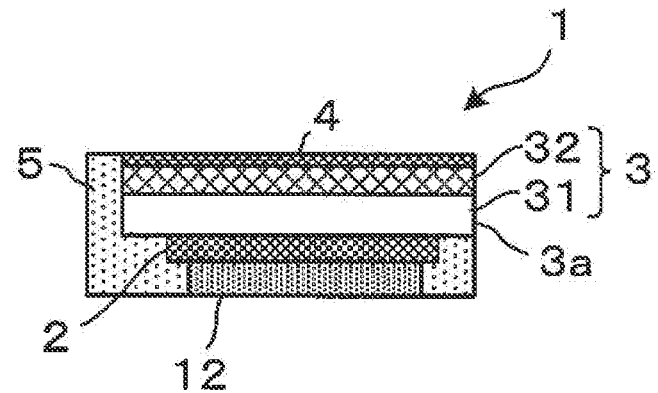
FIG. 1 is a diagram schematically showing a cross section of a semiconductor light emitting device according to an embodiment of the present invention.

In a conventional semiconductor light emitting device, it is necessary to increase the area of a light extraction surface in order to increase the light emission intensity. Therefore, downsizing of a light emitting device having high luminance has been considered to be difficult.

The embodiment of the present invention has been made in view of such a conventional problem, and an object thereof is to provide a semiconductor light emitting device that achieves downsizing and high luminance by employing a structure capable of increasing the light emission intensity without increasing the area of a light extraction surface and a method of manufacturing the semiconductor light emitting device. The present invention includes following embodiments.

The embodiment of the present invention provides a semiconductor light emitting device that includes a semiconductor stacked layer having a light extraction surface perpendicular to a stacked surface of the semiconductor stacked layer, a light transmissive light guide member disposed on the semiconductor stacked layer, a light reflective member disposed on the light guide member, and a light reflective package that has an open portion corresponding to the light extraction surface and surrounds at least a portion of peripheral surfaces of the semiconductor stacked layer.

Further, the present embodiment provides a method for manufacturing a semiconductor light emitting device that includes a light extraction surface perpendicular to a stacked surface of a semiconductor stacked layer. The method includes arranging a plurality of light emitting elements each having a semiconductor layer and electrodes so that the electrodes are in contact with a sheet, arranging a light guide member having a light reflective member fanned on one surface thereof over and across at least two adjacent ones of the plurality of light emitting elements, arranging a light reflective insulating member to fill a gap between the plurality of light emitting elements, and cutting the insulating member and the light guide member at a position between the at least two adjacent light emitting elements.

The present embodiment makes it possible to increase the light emission intensity without increasing the area of a light extraction surface in a semiconductor light emitting device.

By employing the structure as described above, it is possible to achieve thickness reduction and high luminance of a semiconductor light emitting device. For example, it is possible to increase the area of a semiconductor light emitting layer in the depth direction while maintaining the size of a light extraction surface of a semiconductor light emitting device and thereby achieve high luminance.

Hereinafter, embodiments of the present invention will be described with reference to the drawings. Identical elements and elements having different forms, but having a corresponding relationship will be denoted by the same reference marks throughout the drawings to be referred to. The configurations in these drawings are merely examples for explaining the semiconductor light emitting device of the present invention. Further, the drawings are schematic views illustrating members of the semiconductor light emitting device in an exaggerated manner. Therefore, the present invention is not limited to these drawings and the description of the embodiments.

Figure 2:
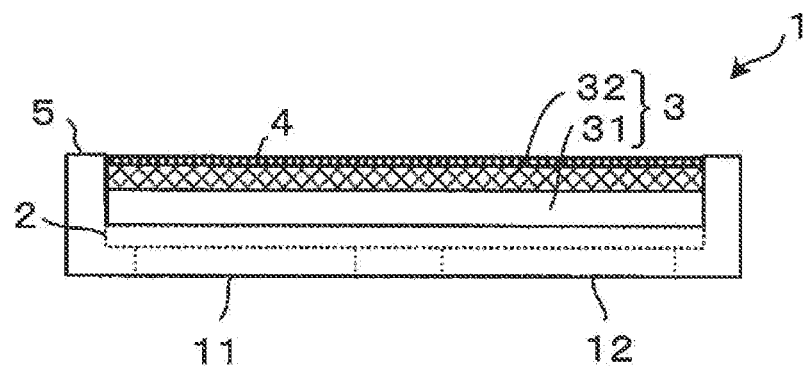
FIG. 2 is a front view of the semiconductor light emitting device shown in FIG. 1 viewed from a light extraction surface.

FIG. 1 is a diagram schematically showing a cross section of a semiconductor light emitting device 1 according to an embodiment of the present invention. FIG. 2 is a front view of the semiconductor light emitting device 1 shown in FIG. 1 viewed from a light extraction surface.

The semiconductor light emitting device 1 includes a semiconductor stacked layer 2 which is an LED and a light extraction surface 3a for extracting light emitted from the semiconductor stacked layer 2 to the outside. The light extraction surface 3a may be substantially perpendicular to the semiconductor stacked layer 2. When the light extraction surface 3a is perpendicular at least to an active layer (p-n junction layer) which is an intermediate layer of the semiconductor stacked layer 2, the light extraction surface 3a can be regarded as being perpendicular or substantially perpendicular to the semiconductor stacked layer 2.

For example, a GaN-based LED which is composed of a nitride-based compound semiconductor (represented by a general formula of $In_xAl_yGa_{1-x-y}N$ ($0 \le x$, $0 \le y$, $x+y \le 1$) can be used as the semiconductor stacked layer 2. Examples of a GaN-based LED include an ultraviolet LED, a blue LED, a green LED, and the like. The semiconductor stacked layer 2 which constitutes an LED may be composed of another compound semiconductor such as a ZnSe-based compound semiconductor, an InGaAs-based compound semiconductor, and an AlInGaP-based compound semiconductor. In this case, the wavelength band of color of light emitted from the LED may be the entire region from ultraviolet light to visible light.

The semiconductor stacked layer 2 may be formed, for example, by a metal organic chemical vapor deposition (MOCVD) method by sequentially stacking layers on a growth substrate such as a sapphire substrate. Further, the semiconductor stacked layer 2 may also be formed by another vapor or liquid phase deposition method.

Further, the semiconductor light emitting device 1 includes a light transmissive light guide member 3 disposed on the semiconductor stacked layer 2, a light reflective member 4 disposed on the light guide member 3, and a light reflective package 5 which has an open portion corresponding to the light extraction surface 3a and surrounds peripheral surfaces of the semiconductor stacked layer 2. The package 5 may cover the upper surface of the light reflective member 4.

The light transmissive light guide member 3 may be, for example, a glass substrate. The light guide member 3 may have a single layer structure and may also have a multilayer structure which includes a transparent portion 31 and a wavelength conversion portion 32 which converts the wavelength of light emitted from the semiconductor stacked layer 2 and includes, for example, a phosphor, the wavelength conversion portion 32 and the transparent portion 31 being stacked. For example, the light guide member 3 may be a glass substrate having a phosphor layer formed on one surface thereof.

The light guide member 3 may seal the semiconductor stacked layer 2. Such a sealing member is preferably composed of a resin containing a phosphor. The sealing member may not necessarily contain a phosphor, and may be a resin that contains a diffusing material (filler or the like) or a coloring material (a pigment or the like).

The light guide member 3 may be disposed in contact with the semiconductor stacked layer 2, and may also be disposed on the semiconductor stacked layer 2 with a certain kind of medium layer such as a transparent adhesive layer interposed therebetween. Further, the light guide member 3 may also be disposed on the semiconductor stacked layer 2 with a growth substrate such as a sapphire substrate that is used for forming the semiconductor stacked layer 2 interposed therebetween.

The light reflective member 4 is preferably a DBR (Distributed Bragg Reflector) which is formed on the surface of the light guide member 3. The DBR is a diffraction grating having a spatial period of $\lambda/2n$ (wherein $\lambda$ denotes the wavelength of light in vacuum, and n denotes the refractive index of a medium (specifically, the light guide member)). The light reflective member 4 which is the DBR has a function of reflecting light, emitted from the semiconductor stacked layer 2 toward the light guide member 3. Accordingly, light emitted from the semiconductor stacked layer 2 is efficiently guided to the light extraction surface 3a through the light guide member 3.

The light reflective member 4 may be formed of metal having light reflectivity or glossiness such as Ag and Al. The light reflective member 4 may be a stacked body of a metal layer and a DBR layer.

The package 5 is preferably formed of a thermosetting resin such as a silicone resin and an epoxy resin. The package 5 may be formed of an electrically insulating material. The thermosetting resin preferably includes one kind of oxide selected from the group consisting of Ti oxide, Zr oxide, Nb oxide, Al oxide, and Si oxide or at least one selected from AlN and MgF. In particular, at least one selected from the group consisting of $TiO_2$, $ZrO_2$, $Nb_2O_5$, $Al_2O_3$, MgF, AlN, and $SiO_2$ is preferably mixed with the thermosetting resin. By employing these materials, it is possible to impart preferred electrically insulating property, mechanical strength, and light reflectivity to the package 5.

As the package 5, a thermoplastic resin that can be transfer-molded may be used in addition to the above resins.

The package 5 having both light reflectivity and electrically insulating property as described above may be integrated with an insulating member which electrically insulates an n-electrode 11 and a p-electrode 12 both connected to the semiconductor stacked layer 2. Accordingly the structure of the semiconductor light emitting device 1 is simplified, and the number of manufacturing processes is reduced.

The light extraction surface 3a of the semiconductor light emitting device 1 includes the end surface of the transparent portion 31 and the end surface of the wavelength conversion portion 32. Further, an end part of the semiconductor stacked layer 2 the end part corresponding to the light extraction surface 3a, is covered with the package 5. Therefore, light emitted from the end part of the semiconductor stacked layer 2 corresponding to the light extraction surface 3a is suppressed, As a result, color unevenness can be suppressed.

First Embodiment

Figure 3:
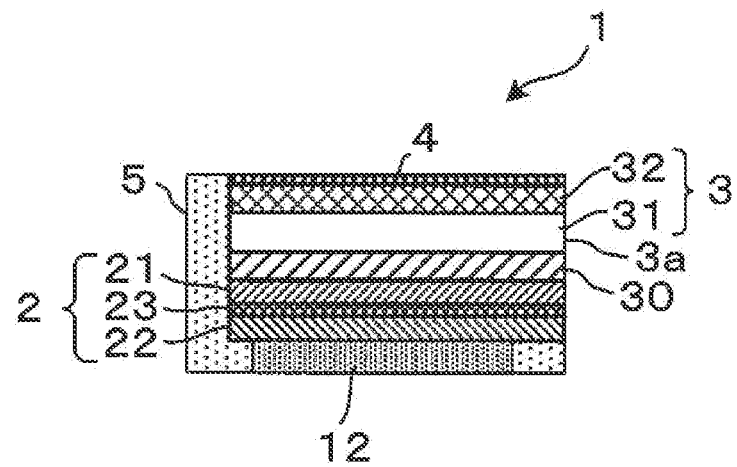
FIG. 3 is a cross-sectional view of a semiconductor light emitting device; according to a first embodiment of the present invention.

FIG. 3 is a cross-sectional view of a semiconductor light emitting device according to a first embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. The n-electrode 11 is disposed behind the p-electrode 12 as shown in FIG. 2.

As shown in FIG. 3, the semiconductor light emitting device 1 emits light in such a manner that a forward current is supplied to the semiconductor stacked layer 2 to thereby move carriers to an active layer 23 so as to be trapped therein and recombination of the carriers efficiently occurs in the active layer 23. The active layer 23 is also called a light emitting layer. In the semiconductor stacked layer 2, an n-type semiconductor layer 21, the active layer 23, and a p-type semiconductor layer 22 are stacked in this order on a growth substrate 30. The active layer 23 has a quantum well structure. In the present embodiment, a nitride semiconductor is used as the semiconductor stacked layer 2.

For example, the n-type semiconductor layer 21 includes a GaN layer that contains Si, and the p-type semiconductor layer 22 includes a GaN layer that contains Mg or Zn. The active layer 23 includes a GaN layer or an InGaN layer. The active layer 23 emits blue light.

The n-electrode 11 as a cathode of the LED is electrically joined to the n-type semiconductor layer 21. On the other hand, the p-electrode 12 as an anode of the LED is electrically joined to the p-type semiconductor layer 22. For example, an under barrier metal (UBM) film is formed at a predetermined position in each of the n-type semiconductor layer 21 and the p-type semiconductor layer 22 by sputtering or the like and the formed UBM film is then plated with conductive metal with excellent wettability, for example, Au, thereby obtaining the n-electrode 11 and the p-electrode 12 in a bump form.

In order to achieve an LED having higher luminance, a light reflective layer (not illustrated) may be disposed on the lower surface of the p-type semiconductor layer 22. The light reflective layer may be, for example, a DBR that is formed as a part of the p-type semiconductor. That is, the light reflective layer which is composed of the DBR can diffract light that has been emitted from the active layer 23 toward the electrodes 11, 12 to the opposite side and supply a forward current to the active layer 23 and the n-type semiconductor layer 21. Further, a metal layer having high reflectivity such as an Ag layer and an Al layer can be used as the light reflective layer. Such a metal layer can serve as a part of the p-electrode 12.

A light extraction surface 3a of the semiconductor light emitting device 1 is formed on one side surface of the semiconductor light emitting device 1 so as to be perpendicular to the semiconductor stacked layer 2. A light transmissive light guide member 3 is disposed on the semiconductor stacked layer 2 with the growth substrate (sapphire substrate) 30 interposed therebetween. As another form of the semiconductor light emitting device 1, the light guide member 3 may be disposed in contact with the semiconductor stacked layer 2 after the growth substrate 30 is removed by a laser lift off (LLO) method.

The light guide member 3 includes a transparent portion 31 which is a transparent glass substrate, and a wavelength conversion portion 32 which is a phosphor layer. In the present embodiment, the phosphor layer is formed on one surface of the glass substrate in the light guide member 3.

The wavelength conversion portion 32 may contain, for example, a nitride-based or oxynitride-based phosphor activated by a lanthanoid-based element such as Ce and Eu. More specifically, for example, a rare earth aluminate phosphor activated by a lanthanoid-based element such as Ce may be used as the phosphor, and a YAG-based phosphor is preferably used. In the YAG-based phosphor, a part or the entire of Y may be substituted with Tb or Lu. Further, Ce-activated rare earth silicate may be used as the material of the phosphor.

Further, alkaline earth halogen apatite, alkaline earth metal borate halogen, alkaline earth metal aluminate alkaline earth metal sulfide, alkaline earth metal thiogallate, alkaline earth metal silicon nitride, or alkaline earth metal germanate activated by a lapthanoid-based element such as Eu, or an organic body or an organic complex activated by a lanthanoid-based element such as Eu may be used as the material of the phosphor. Examples of a red phosphor include a SCASN-based phosphor such as $(Sr, Ca)AlSiN_3$:Eu, a CASN-based phosphor such as $CaAlSiN_3$:Eu, and $SrAlSiN_3$:Eu. In addition to the above, a phosphor that absorbs blue light emitted from a light emitting element and emits green light, for example, a chlorosilicate phosphor or a β-sialon phosphor may be used as the material. Further, the material may be at least one selected from the group consisting of a $Mn^{4+}$ activated Mg fluorogermanate phosphor and a $M^1_2M^2F_6:Mn^{4+}$ ($M^1$=Li, Na, K, Rb, Cs; $M^2$=Si, Ge, Sn, Ti, Zr) phosphor.

The semiconductor light emitting device 1 includes a light reflective member 4 which is disposed on the light guide member 3. The light reflective member 4 is a DBR which is formed on the surface of the wavelength conversion portion 32 of the light guide member 3. The light reflective member 4 may also be metal having light reflectivity or glossiness such as Ag and Al. The light reflective member 4 may also be a stacked body of metal and a DBR.

The semiconductor light emitting device 1 includes a package 5 which has an open portion corresponding to the light extraction surface 3a and surrounds peripheral surfaces of the semiconductor stacked layer 2. The material of the package 5 is an electrically insulating thermosetting resin such as a silicone resin and an epoxy resin. The material of the package 5 includes one kind of oxide selected from the group consisting of Ti oxide, Zr oxide, Nb oxide, Al oxide, and Si oxide or at least one selected from AlN and MgF so that the package 5 has a light reflective white color. In particular, at least one selected from the group consisting of $TiO_2$, $ZrO_2$, $Nb_2O_5$, $Al_2O_3$MgF, AlN, and $SiO_2$ is preferably mixed with the resin. These resin materials can impart preferred electrically insulating property, mechanical strength, and light reflectivity to the package 5.

The semiconductor light emitting device 1 includes the light reflective member 4 disposed on the light guide member 3, and the light reflective package 5 which has the open portion corresponding to the light extraction surface 3a and surrounds the peripheral surfaces of the semiconductor stacked layer 2. Accordingly, light emitted from the semiconductor stacked layer 2 is reflected by the light reflective member 4 and the package 5, and efficiently guided to the light extraction surface 3a through the light guide member 3. As a result, the semiconductor light emitting device 1 that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface 3a.

In the embodiments of the present specification, the semiconductor light emitting device that includes the package having a dimension of 2 mm×1 mm and a thickness of 0.3 mm is used. However the dimension of the package is not particularly limited.

Next, a method for manufacturing the semiconductor light emitting device of the first embodiment will be described with reference to FIGS. 4A to 4E.

First, a plurality of light emitting elements 40 are prepared. In each of the light emitting elements 40, the semiconductor stacked layer 2 which is an LED, the n-electrode 11, the p-electrode 12, a predetermined protective film layer, and the like are formed on the growth substrate 30. The semiconductor stacked layer 2 is formed of a nitride-based semiconductor such as GaN. A sapphire single crystal substrate is used as the growth substrate 30.

Figure 4A:
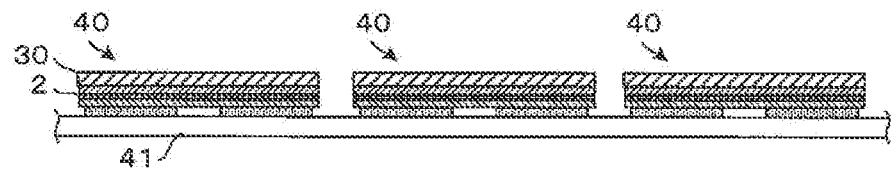
FIGS. 4A to 4E are diagrams for explaining a method for manufacturing the semiconductor light emitting device shown in FIG. 3.
Figure 4B:
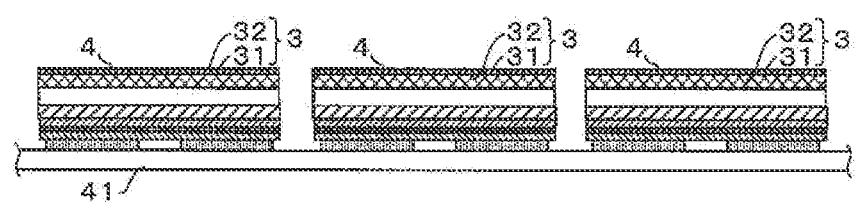

The plurality of light emitting elements 40 are placed on an adhesive sheet 41 so that the growth substrates 30 face upward and the n-electrodes 11 and the p-electrodes 12 are in contact with the adhesive sheet 41 (FIG. 4A). Then, the light guide member 3 is disposed on the growth substrate 30 (FIG. 4B). In the light guide member 3, the light reflective member 4 is previously formed on a surface opposite to a surface on which the light emitting element 40 is disposed. In the light guide member 3 of the present embodiment, the wavelength conversion portion 32 which includes a YAG-based phosphor is stacked on the transparent portion 31 which is a transparent glass substrate. Further, a DBR as the light reflective member 4 is formed on the surface of the wavelength conversion portion 32.

In another embodiment, the light guide member is disposed on the growth substrate over and across at least two adjacent light emitting elements.

Figure 4C:
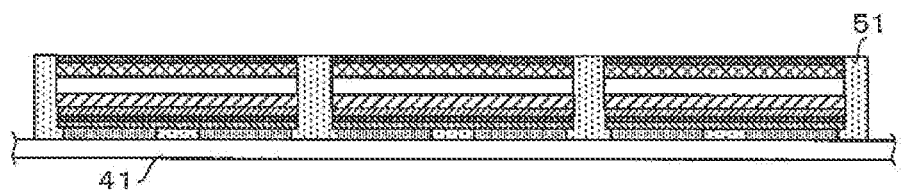

Then, a light reflective insulating member 51 is disposed to fill a gap between the plurality of light emitting elements 40 (FIG. 4C). The insulating member 51 is the material of the package 5. The insulating member 51 is a silicone thermosetting resin mixed with at least one selected from the group consisting of $TiO_2$, $ZrO_2$, $Nb_2O_5$, $Al_2O_3$, MgF, AlN, and $SiO_2$. The insulating member 51 is also filled into a gap between the electrodes 11, 12 in order to insulate the electrodes 11, 12 of the light emitting element 40.

Figure 4D:
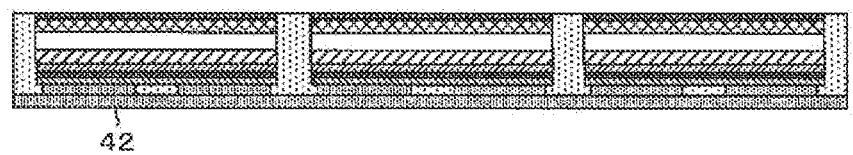

As a method for molding the insulating member 51, a general molding method such as a compression molding method, a transfer molding method, and an injection molding method can be employed. After curing the insulating member 51 by heating, pad electrodes 42 which are electrically connected to the electrodes 11, 12 of the light emitting elements 40 may be optionally formed (FIG. 4D).

Figure 4E:
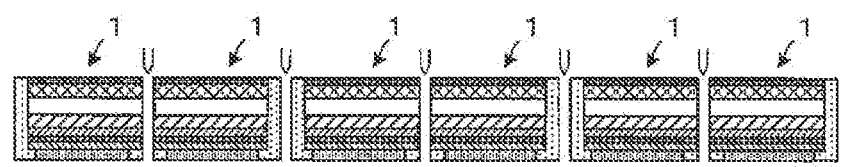

Then, the insulating member 51 and the light guide member 3 are cut at a position between at least two adjacent light emitting elements 40 (FIG. 4E). As a method for cutting the insulating member 51 and the light guide member 3, for example, dicing or diamond cut is used. The semiconductor light emitting device 1 that achieves downsizing and high luminance is provided through the manufacturing processes as described above.

The light extraction surface 3a of the semiconductor light emitting device 1 includes the end surface of the transparent portion 31 and the end surface of the wavelength conversion portion 32. Further, in a case that an end part of the semiconductor stacked layer 2, the end part corresponding to the light extraction surface 3a, is covered with the insulating member 51, light emitted from the end part of the semiconductor stacked layer 2 corresponding to the light extraction surface 3a is suppressed. As a result, color unevenness can be suppressed.

Second Embodiment

Figure 5:
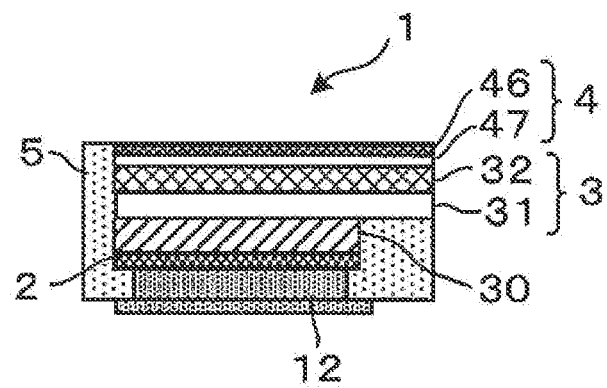
FIG. 5 is a cross-sectional view of a semiconductor light emitting device according to a second embodiment of the present invention.

FIG. 5 is a cross-sectional view of a semiconductor light emitting device according to a second embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 5, the n-electrode 11 is disposed behind the p-electrode 12 as shown in FIG. 2.

A light extraction surface of the semiconductor light emitting device 1 is formed on one side surface of the semiconductor light emitting device 1 so as to be perpendicular to the semiconductor stacked layer 2. A light guide member 3 which includes a transparent portion 31 and a wavelength conversion portion 32, is disposed on the semiconductor stacked layer 2 with a growth substrate 30 interposed therebetween. The transparent portion 31 is a transparent glass substrate. The wavelength conversion portion 32 is a YAG-based phosphor. In the present embodiment, as illustrated in FIG. 5, the transparent portion 31 of the light guide member 3 is in contact with the growth substrate 30.

A light reflective member 4 is disposed on the light guide member 3. The light reflective member 4 includes two layers, specifically, a metal layer 46 which contains a metallic element having light reflectivity or glossiness such as Ag and Al and a DBR 47. In the embodiment illustrated in FIG. 5 the metal layer 46 is disposed on the surface of the wavelength conversion portion (YAG) 32 with the DBR 47 interposed therebetween. The metal layer 46 may be directly disposed on the surface of the wavelength conversion portion (YAG) 32 without the DBR interposed therebetween.

The semiconductor light emitting device 1 includes a package 5 which has an open portion corresponding to the light extraction surface and surrounds peripheral surfaces of the semiconductor stacked layer 2, the light guide member 3, and the light reflective member 4, The material of the package 5 is an electrically insulating thermosetting resin such as a silicone resin, At least one selected from the group consisting of $TiO_2$, $ZrO_2$, $Nb_2O_5$, $Al_2O_3$, MgF, AlN, and $SiO_2$ is mixed with the thermosetting resin of the package 5. These resin materials can impart preferred electrically insulating property, mechanical strength, and light reflectivity to the package 5.

The semiconductor light emitting device 1 according to the second embodiment includes the light reflective package 5 which has the open portion corresponding to the light extraction surface and surrounds the peripheral surfaces of the semiconductor stacked layer 2, the light guide member 3, and the light reflective member 4. Accordingly, light emitted from the semiconductor stocked layer 2 is reflected by the light reflective member 4 and the package 5, and efficiently guided to the light extraction surface through the light guide member 3. As a result, the semiconductor light emitting device that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface.

An end part of the semiconductor stacked layer 2, the end part corresponding to the light extraction surface 3a, is covered with the insulating member 5. Therefore, light emitted from the end part of the semiconductor stacked layer 2 corresponding to the light extraction surface 3a is suppressed. As a result, color unevenness can be suppressed.

In the light guide member 3 described above, the transparent portion 31 and the wavelength conversion portion 32 are stacked in this order on the growth substrate 30, In the light reflective member 4, the DBR 47 and the metal layer 46 are stacked in this order on the wavelength conversion portion 32.

Third Embodiment

Figure 6:
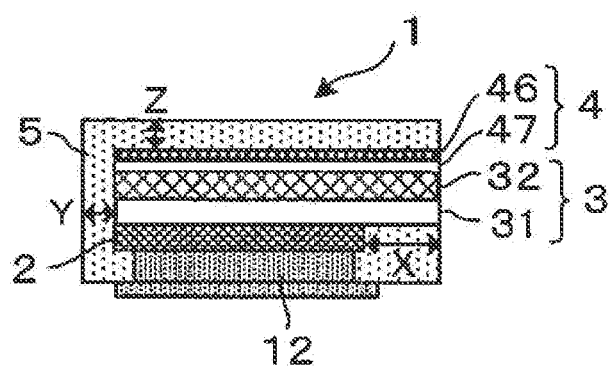
FIG. 6 is a cross-sectional view of semiconductor light emitting device according to a third embodiment of the present invention.

FIG. 6 is a cross-sectional view of a semiconductor light emitting device according to a third embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 6, the n-electrode 11 is disposed behind the p-electrode 12, as shown in FIG. 2.

A light extraction surface of the semiconductor light emitting device 1 is formed on one side surface of the semiconductor light emitting device 1 so as to be perpendicular to the semiconductor stacked layer 2. Further, the semiconductor light emitting device 1 includes a package 5 which has an open portion corresponding to the light extraction surface and surrounds peripheral surfaces of the semiconductor stacked layer 2, a light guide member 3, and a light reflective member 4. The material of the package 5 is an electrically insulating thermosetting resin such as a silicone resin. At least one selected from the group consisting of $TiO_2$, $ZrO_2$, $Nb_2O_5$, $Al_2O_3$, MgF, AlN, and $SiO_2$ is mixed with the thermosetting resin of the package 5.

The light guide member which includes a transparent portion 31 and a wavelength conversion portion 32 is disposed, on the semiconductor stacked layer 2 after a growth substrate (not illustrated) is removed by a laser lift off (LLO) method. The transparent portion 31 is a transparent glass substrate. The wavelength conversion portion 32 is a YAG-based phosphor. In the present embodiment, as illustrated in FIG. 6, the transparent portion 31 of the light guide member 3 is in contact with the semiconductor stacked layer 2.

The light reflective member 4 is disposed on the light guide member 3. The light reflective member 4 is a stacked body of a DBR 47 and a metal layer 46 which contains a metallic element having light reflectivity or glossiness such as Ag and Al. In the embodiment illustrated in FIG. 6, the metal layer 46 is disposed on the surface of the wavelength conversion portion (YAG) 32 with the DBR 47 interposed therebetween. The metal layer 46 may be directly disposed on the surface of the wavelength conversion portion (YAG) 32 without the DBR interposed therebetween.

In the package 5, a width X between e end of the semiconductor stacked layer 2 and the end of the package 5 on the side corresponding to the light extraction surface is several μ or more, and preferably 30 μm or more. For example, in the present embodiment, the width X is 50 μm. A width Y between the end of the semiconductor stacked layer 2 and the end of the package 5 on the side opposite to the light extraction surface is 50 μm or more, and preferably 100 μm or more. thickness Z of the package 5 above the light reflective member 4 is preferably 5 μm or more. Accordingly, it is possible to achieve higher luminance in the semiconductor light emitting device.

In the semiconductor light emitting device 1 according to the third embodiment, an insulating member continuously covers the end part of the semiconductor stacked layer 2 through the upper surface of the metal layer 46. Therefore, it is possible to suppress light leaking to the upper side of the semiconductor light emitting device 1.

The semiconductor light emitting device 1 according to the third embodiment includes the light reflective package 5 which has the open portion corresponding to the light extraction surface and surrounds the peripheral surfaces of the semiconductor stacked layer 2, the light guide member 3, and the light reflective member 4. Accordingly, light emitted from the semiconductor stacked layer 2 is reflected by the light reflective member 4 and the package 5, and efficiently guided to the light extraction surface through the light guide member 3. As a result, the semiconductor light emitting device that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface. More specifically, it is possible to increase the area of the semiconductor light emitting layer in the depth direction while maintaining the size of the light extraction surface of the semiconductor light emitting device and thereby achieve high luminance.

Fourth Embodiment

Figure 7:
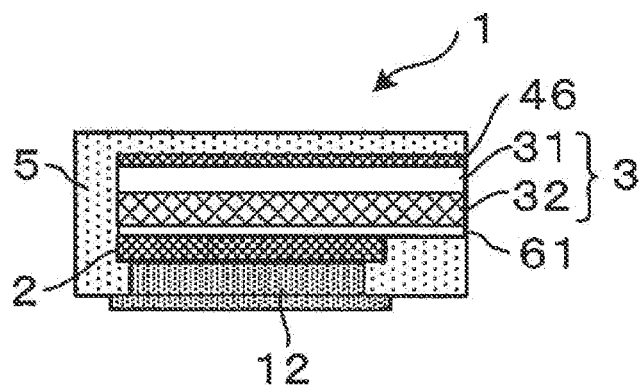
FIG. 7 is a cross-sectional view of a semiconductor light emitting device according to a fourth embodiment of the present invention.

FIG. 7 is a cross-sectional view of a semiconductor light emitting device according to a fourth embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 7, the n-electrode 11 is disposed behind the p-electrode 12 as shown in FIG. 2.

A light extraction surface of the semiconductor light emitting device 1 is formed on one side surface of the semiconductor light emitting device 1 so as to be perpendicular to the semiconductor stacked layer 2. Further, the semiconductor light emitting device 1 includes a package, 5 which has an open portion corresponding to the light extraction surface and surrounds peripheral surfaces of the semiconductor stacked layer 2, a light guide member 3, and a metal layer 46. The material of the package 5 is an electrically insulating thermosetting resin such as a silicone resin. At least one selected from the group consisting of $TiO_2$, $ZrO_2$, $Nb_2O_5$, $Al_2O_3$, MgF, AlN, and $SiO_2$ is mixed with the thermosetting resin of the package 5. These resin materials can impart preferred electrically insulating property, mechanical strength, and light reflectivity to the package 5.

The light guide member 3 which includes a transparent portion 31 and a wavelength conversion portion 32 is disposed on the semiconductor stacked layer 2 after a growth substrate (not illustrated) is removed by an LLO method. The transparent portion 31 is a transparent glass substrate. The wavelength conversion portion 32 is a YAG-based phosphor. In the present embodiment, as illustrated in FIG. 7, the metal layer 46 which contains a metallic element having light reflectivity or glossiness such as Ag and Al is formed on the transparent portion (glass substrate) 31 by an electroless plating method or the like. A DBR (not illustrated) may be formed on the transparent portion (glass substrate) 31, and the metal layer 46 may be formed on the DBR.

The wavelength conversion portion (YAG) 32 is adhered to the semiconductor stacked layer 2 with an adhesive layer 61 interposed therebetween. The adhesive layer 61 is formed of a transparent resin material.

The semiconductor light emitting device 1 according to the fourth embodiment includes the light reflective package 5 which has the open portion corresponding to the light extraction surface and surrounds the peripheral surfaces of the semiconductor stacked layer 2, the light guide member 3, and the metal layer 46. Accordingly, light emitted from the semiconductor stacked layer 2 is reflected by the metal layer 46 and the package 5, and efficiently guided to the light extraction surface through the light guide member 3. As a result, the semiconductor light emitting device that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface.

Fifth Embodiment

Figure 8:
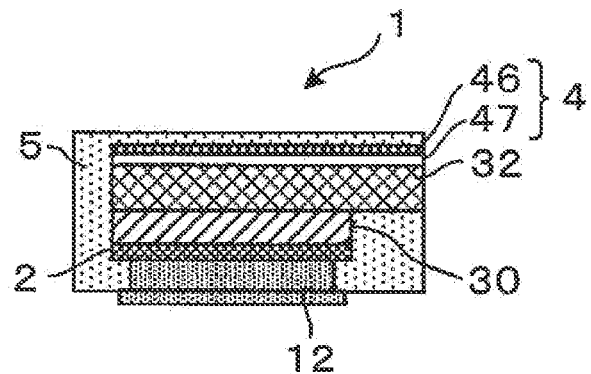
FIG. 8 is a cross-sectional view of a semiconductor light emitting device according to a fifth embodiment of the present invention.

FIG. 8 is a cross-sectional view of a semiconductor light emitting device according to a fifth embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 8, the n-electrode 11 is disposed behind the p-electrode 12 as shown in FIG. 2.

A light extraction surface of the semiconductor light emitting device is formed on one side surface of the semiconductor light emitting device 1 so as to be perpendicular to the semiconductor stacked layer 2. Further, the semiconductor light emitting device 1 includes a package 5 which has an open portion corresponding to the light extraction surface and surrounds peripheral surfaces of the semiconductor stacked layer 2, a wavelength conversion portion 32, and a light reflective member 4. The material of the package 5 is an electrically insulating thermosetting resin such as a silicone resin. At least one selected from the group consisting of $TiO_2$, $Nb_2O_5$, $Al_2O_3$, MgF, AlN, and $SiO_2$ is mixed with the thermosetting resin of the package 5.

The wavelength conversion portion 32 which is a YAG-based phosphor is disposed on the semiconductor stacked layer 2 with a growth substrate 30 interposed therebetween. In the present embodiment, as illustrated in FIG. 8, the wavelength conversion portion 32 is directly joined to the growth substrate 30 of the semiconductor stacked layer 2. Here, "direct joining" indicates that surfaces to be joined are joined by atomic bond without using an adhesive. Direct joining that can be used here is preferably a joining method that is generally classified as room-temperature joining. Direct joining also includes a method that accelerates a chemical reaction or diffusion for joining at an extremely high temperature. However, such a method is not preferred in LED production of the present invention because of temperature limitation. For example, there is also an anode joining method that performs joining by applying not temperature, but an electric field. However, such a method is also not preferred because there is concern about a surface layer material that is required for applying an electric field and the influence on the semiconductor.

Examples of a direct joining method suitable for the present embodiment include surface activation joining, atomic diffusion joining, and hydroxyl group joining, In surface activation joining, inert ions are applied to the joining interface in ultrahigh vacuum to thereby clean and activate the surface to perform joining. In atomic diffusion joining, metal is sputtered also in ultrahigh vacuum and joining is performed using diffusion of the metal. It has been confirmed that, by making the sputtered film extremely thin, the joining can be performed without affecting extraction of light. In hydroxyl group joining, a hydroxyl group is formed on the joining interface and joining is performed using hydrogen bond of the hydroxyl group. The above three joining methods are all room-temperature joining methods. However, a bonding power may increase by performing heat treatment as needed. In this case, heating can be performed at 400° C. or less, preferably at 300° C. or less, and more preferably at 200° C. or less.

Further, "direct joining" indicates that different kinds of materials are joined without an organic material such as an adhesive interposed therebetween. Even when metal or a dielectric substance is introduced as an intermediate member, the optical characteristic of the intermediate member is ignored when introducing light into a joining member. As the joining member, for example, a YAG phosphor can be used.

The light reflective member 4 is disposed on the wavelength conversion portion 32, The light reflective member 4 includes two layers, specifically, a DBR 47 and a metal layer 46 which contains a metallic element having light reflectivity or glossiness such as Ag and Al. In the present embodiment, as illustrated in FIG. 8, the metal layer 46 is disposed on the surface of the wavelength conversion portion (YAG) 32 with the DBR 47 interposed therebetween. The metal layer 46 may he directly disposed on the surface of the wavelength conversion portion (YAG) 32 without the DBR 47 interposed therebetween.

The semiconductor light emitting device 1 according to the fifth embodiment includes the light reflective package 5 which has the open portion corresponding to the light extraction surface and surrounds the peripheral surfaces of the semiconductor stacked layer 2, the wavelength conversion portion (YAG) 32, and the light reflective member 4. Accordingly, light emitted from the semiconductor stacked layer 2 is reflected by the light reflective member 4 and the package 5, then wavelength-converted by the wavelength conversion portion (YAG) 32, and then efficiently guided to the light extraction surface. As a result, the semiconductor light emitting device that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface.

Sixth Embodiment

Figure 9:
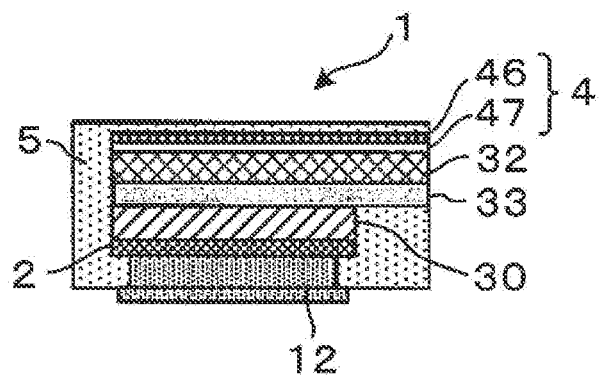
FIG. 9 is a cross-sectional view of a semiconductor light emitting device according to a sixth embodiment of the present invention.

FIG. 9 is a cross-sectional view of a semiconductor light emitting device according to a sixth embodiment of the present invention. A semiconductor light emitting device I includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 9, the n-electrode 11 is disposed behind the p-electrode 12 as shown in FIG. 2.

A light extraction surface of the semiconductor light emitting device 1 is formed on one side surface of the semiconductor light emitting device 1 so as to be perpendicular to the semiconductor stacked layer 2. In the semiconductor light emitting device 1, a BPF (Band Pass Filter) 33 which has an open portion corresponding to the light extraction surface, a wavelength conversion portion 32, and a light reflective member 4 are stacked in this order on the semiconductor stacked layer 2. Further, the semiconductor light emitting device 1 includes a package 5 which surrounds outer peripheral surfaces of the light reflective member 4. The above-described resins can be used as the material of the package 5.

The wavelength conversion portion 32 which is a YAG-based phosphor is disposed on a growth substrate 30 of the semiconductor stacked layer 2 with the BPF 33 interposed therebetween. The BPF 33 is an optical filter that transmits light having a wavelength band of for example, 420 to 500 nm. The wavelength band of the BPF 33 is preferably 430 to 470 nm. A peak of the LED that is composed of the nitride-based semiconductor stacked layer 2 is 450 nm.

The light reflective member 4 is disposed on the wavelength conversion portion 32. The light reflective member 4 includes two layers, specifically, a DBR 47 and a metal layer 46 which contains a metallic element having light reflectivity or glossiness such as Ag and Al. In the present embodiment, as illustrated in FIG. 9, the metal layer 46 is disposed on the surface of the wavelength conversion portion (YAG) 32 with the DBR 47 interposed therebetween, The metal layer 46 may be directly disposed on the surface of the wavelength conversion portion (YAG) 32 without the DBR 47 interposed therebetween.

Seventh Embodiment

Figure 10:
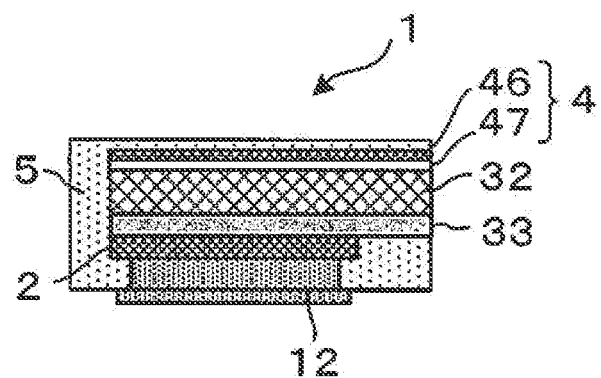
FIG. 10 is a cross-sectional view of a semiconductor light emitting device according to a seventh embodiment of the present invention.

FIG. 10 is a cross-sectional view of a semiconductor light emitting device according to a seventh embodiment of the present invention. A semiconductor light emitting device 1 includes a semiconductor stacked layer 2 which constitutes an LED as a light emitting element, and an n-electrode 11 and p-electrode 12 each formed on the lower surface of the semiconductor stacked layer 2. A pad electrode may be formed in contact with the n-electrode 11 and the p-electrode 12. In FIG. 10, the n-electrode 11 is disposed behind the p-electrode 12 as shown in FIG. 2.

A light extraction surface of the semiconductor light emitting device 1 is formed on one side surface of the semiconductor light emitting device 1 so as to be perpendicular to the semiconductor stacked layer 2. Further, the semiconductor light emitting device 1 includes a package 5 which has an open portion corresponding to the light extraction surface and surrounds peripheral surfaces of the semiconductor stacked layer 2, a BPF 33, a wavelength conversion portion 32, and a light reflective member 4. The above-described resins can be used as the, material of the package 5.

A light guide member which includes the BPF 33 and the wavelength conversion portion 32 which is a YAG-based phosphor is disposed on the semiconductor stacked layer 2 after a growth substrate (not illustrated) is removed by an LLO method in the present embodiment, as illustrated in FIG. 10, the BPF 33 is in contact with the semiconductor stacked layer 2.

The BPF 33 is an optical filter that transmits light having a wavelength band of, for example, 420 to 500 nm. The wavelength band of the BPF 33 is preferably 430 to 470 nm. A peak of the LED that is composed of the nitride-based semiconductor stacked layer 2 is 450 nm.

The light reflective member 4 includes two layers, specifically, a DBR 47 and a metal layer 46 which contains a metallic element having light reflectivity or glossiness such as Ag and Al. In the embodiment illustrated in FIG. 10, the metal layer 46 is disposed on the surface of the wavelength conversion portion (YAG) 32 with the DBR 47 interposed therebetween. The metal layer 46 may be directly disposed on the surface of the wavelength conversion portion (YAG) 32 without the DBR 47 interposed therebetween.

Eighth Embodiment

Figure 11:
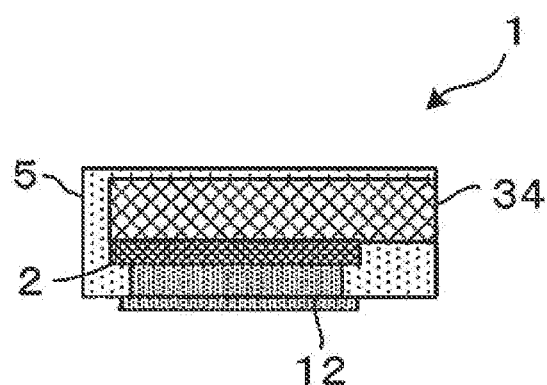
FIG. 11 is a cross-sectional view of a semiconductor light emitting device according to an eighth embodiment of the present invention.
Figure 12:
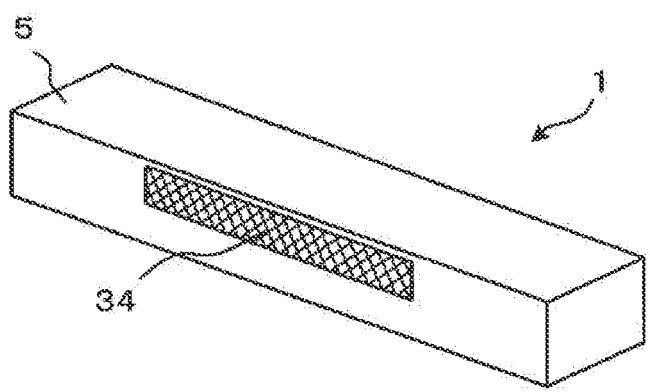
FIG. 12 is a perspective view of the semiconductor light emitting device shown in FIG. 11.

FIG. 11 is a cross-sectional view of a semiconductor light emitting device according to an eighth embodiment of the present invention. FIG. 12 is a perspective view of the semiconductor light emitting device of FIG. 11 The semiconductor light emitting device in each of the third to seventh embodiments described above also has the same appearance as illustrated in FIG. 12. A semiconductor light emitting device includes a semiconductor stacked layer 2 which constitutes an LED as a light emitting element and an n-electrode 11 and p-electrode 12 each formed on the lower surface of the semiconductor stacked layer 2. In FIG. 11, the n-electrode 11 is disposed behind the p-electrode 12 as shown in FIG. 2.

A light extraction surface of the semiconductor light emitting device 1 is formed on one side surface of the semiconductor light emitting device 1 so as to be perpendicular to the semiconductor stacked layer 2. A package 5 of the semiconductor light emitting device 1 has an open portion corresponding to the light extraction surface and houses the semiconductor stacked layer 2 therein. The semiconductor stacked layer 2 housed in the package 5 is sealed by a sealing member 34.

The sealing member 34 is composed of a light transmissive resin that contains a YAG-based phosphor. However, the sealing member 34 may not necessarily contain a phosphor, and may be a resin that contains a diffusing material (a filler or the like) or a coloring material is pigment or the like). The above-described resins can be used as the material of the package 5.

The semiconductor light emitting device 1 according to the present embodiment includes the light reflective package 5 which has the open portion corresponding to the light extraction surface and houses the semiconductor stacked layer 2 therein. Accordingly, light emitted from the semiconductor stacked layer 2 is reflected inside the package 5, and efficiently guided to the light extraction surface through the sealing member 34. As a result, the semiconductor light emitting device that achieves downsizing and high luminance is provided. Further, by increasing the light emission area in the semiconductor stacked layer 2 in the lateral direction, it is possible to increase the light emission intensity. Therefore, it is possible to increase luminous fluxes to be emitted without increasing the area of the light extraction surface.

The present invention is not limited to the specific embodiments described above. Those skilled in the art can appropriately change non-essential elements or substitute non-essential elements with other known elements in these embodiments within the technical idea disclosed in the present invention.

As described above, it should be obvious that various other embodiments are possible without departing the spirit and scope of the present invention. Accordingly, the scope and spirit of the present invention should be limited only by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for manufacturing a semiconductor light emitting device, the method-comprising:
    disposing a plurality of light emitting elements, each having a semiconductor stacked layer and electrodes, such that the electrodes are in contact with a sheet;
    disposing a light guide member, having a light reflective member formed on one surface thereof, over and across a top surface of the semiconductor stacked layer of at least two adjacent ones of the plurality of light emitting elements;
    disposing a light reflective insulating member to fill a gap between the plurality of light emitting elements; and
    after disposing the insulating member, cutting the insulating member and the light guide member at at least a position between the at least two adjacent light emitting elements,
    wherein the cutting is performed so as to form a light emitting device in which a light extraction surface of the light emitting device is perpendicular to the top surface of the semiconductor stacked layer.

2. The method for manufacturing a semiconductor light emitting device according to claim 1, further comprising:
    forming pad electrodes connecting to respective electrodes of each of the plurality of light emitting elements after the disposing of the light reflective insulating member.

3. A method for manufacturing a semiconductor light emitting device, the method-comprising:
    disposing a plurality of a semiconductor stacked layers and corresponding electrodes on a sheet;
    disposing a light guide member, having a light reflective member formed on one surface thereof, on a top surface of the semiconductor stacked layer of each of at least two adjacent ones of the semiconductor stacked layers and corresponding electrodes;
    disposing a light reflective insulating member to fill a gap between the adjacent semiconductor stacked layers and corresponding electrodes;
    after disposing the insulating member, cutting the insulating member at a position between the adjacent semiconductor stacked layers and corresponding electrodes; and cutting each of the light guide members and semiconductor stacked layers so as to form a light emitting device in which a light extraction surface of the light emitting device is perpendicular to the top surface of the semiconductor stacked layer.

4. The method for manufacturing a semiconductor light emitting device according to claim 3, further comprising:
    forming pad electrodes connecting to respective electrodes of each of the plurality of light emitting elements after the disposing of the light reflective insulating member.

* * * * *